United States Patent
Freedman et al.

(10) Patent No.: US 11,982,818 B2
(45) Date of Patent: May 14, 2024

(54) METHOD AND SYSTEM FOR PROJECTION DISPLAY WITH POLARIZATION SELECTIVE REFLECTORS

(71) Applicant: Magic Leap, Inc., Plantation, FL (US)

(72) Inventors: Barak Freedman, Benyamina (IL); Asaf Pellman, Bet-Yehoshua (IL); Ori Weinstein, Haifa (IL)

(73) Assignee: Magic Leap, Inc., Plantation, FL (US)

( * ) Notice: Subject to any disclaimer, the term of this patent is extended or adjusted under 35 U.S.C. 154(b) by 757 days.

(21) Appl. No.: 17/114,122

(22) Filed: Dec. 7, 2020

(65) Prior Publication Data
US 2021/0157158 A1 May 27, 2021

Related U.S. Application Data

(63) Continuation of application No. PCT/US2019/036135, filed on Jun. 7, 2019.
(Continued)

(51) Int. Cl.
*G02B 27/10* (2006.01)
*G02B 27/01* (2006.01)
(Continued)

(52) U.S. Cl.
CPC ......... *G02B 27/28* (2013.01); *G02B 27/0172* (2013.01); *G02B 27/0176* (2013.01);
(Continued)

(58) Field of Classification Search
CPC .............. G02B 27/28; G02B 27/0172; G02B 27/0176; G02B 30/25; G02B 2027/0123; G02B 2027/0178; G02B 27/283
(Continued)

(56) References Cited

U.S. PATENT DOCUMENTS

2009/0322653 A1 12/2009 Putilin et al.
2010/0202034 A1 8/2010 Freeman et al.
(Continued)

FOREIGN PATENT DOCUMENTS

WO 2018234609 A1 12/2018
WO 2019237051 A1 12/2019

OTHER PUBLICATIONS

PCT/US2019/036135, "International Preliminary Report on Patentability", dated Dec. 17, 2020, 11 pages.
(Continued)

*Primary Examiner* — Audrey Y Chang
(74) *Attorney, Agent, or Firm* — KILPATRICK TOWNSEND & STOCKTON LLP

(57) ABSTRACT

Augmented reality glasses can include a first laser, a second laser, and a scanning mirror. The augmented reality glasses can also include a first polarization selective reflector and a second polarization selective reflector. The first polarization selective reflector is arranged to receive light from the first laser and reflect light received from the first laser at a first angle to the scanning mirror, and the second polarization selective reflector is arranged to receive light from the second laser and reflect light received from the second laser at a second angle to the scanning mirror. The augmented reality glasses can also have an eyepiece having an input coupling port arranged to receive light reflected by the scanning mirror.

20 Claims, 12 Drawing Sheets

Related U.S. Application Data

(60) Provisional application No. 62/682,798, filed on Jun. 8, 2018.

(51) Int. Cl.
*G02B 27/28* (2006.01)
*G02B 30/25* (2020.01)
*G02B 30/60* (2020.01)

(52) U.S. Cl.
CPC ............ *G02B 30/25* (2020.01); *G02B 30/60* (2020.01); *G02B 2027/0123* (2013.01); *G02B 2027/0178* (2013.01)

(58) Field of Classification Search
USPC .................................. 359/15, 630, 629, 633
See application file for complete search history.

(56) References Cited

U.S. PATENT DOCUMENTS

2013/0147685 A1    6/2013  Gupta
2018/0120559 A1*   5/2018  Yeoh ................. G02B 27/0172

OTHER PUBLICATIONS

PCT/US2019/036135, "International Search Report and Written Opinion", dated Sep. 18, 2019, 12 pages.

* cited by examiner

METHOD AND SYSTEM FOR PROJECTION DISPLAY WITH POLARIZATION SELECTIVE REFLECTORS

CROSS-REFERENCES TO RELATED APPLICATIONS

This application is a continuation of International Patent Application No. PCT/US2019/036135, filed on Jun. 7, 2019, entitled "METHOD AND SYSTEM FOR PROJECTION DISPLAY WITH POLARIZATION SELECTIVE REFLECTORS," which claims the benefit of priority to U.S. Provisional Patent Application No. 62/682,798, filed Jun. 8, 2018, entitled "METHOD AND SYSTEM FOR PROJECTION DISPLAY WITH POLARIZATION SELECTIVE REFLECTORS," the contents of which are hereby incorporated by reference in their entirety for all purposes.

BACKGROUND OF THE INVENTION

Modern computing and display technologies have facilitated the development of systems for so-called "virtual reality" or "augmented reality" experiences, wherein digitally produced images or portions thereof are presented in a wearable device to a user in a manner wherein they seem to be, or may be perceived as, real. A virtual reality, or "VR," scenario typically involves presentation of digital or virtual image information without transparency to other actual real-world visual input; an augmented reality, or "AR," scenario typically involves presentation of digital or virtual image information as an augmentation to visualization of the actual world around the user.

The wearable device may include augmented and/or virtual reality glasses. The image can be displayed using image frames or raster scanned images. In a scanning image display system, each angle (or small angular range of the scan) of the light beams defines the pixels of the image. By scanning the mirrors in two orthogonal axes, a two-dimensional field of view (FOV) can be created. Scanned beams can be coupled through glasses lenses that take the form of waveguide displays. The image display systems can be mounted on each of the left and right sides of the glasses frames.

One drawback of scanned beam displays is that there is generally a tradeoff between scan frequency, which determines the product of resolution and frame rate on the one hand and scan angular range, which determines the angular field of view. Additionally, certain compact laser diodes that have a size suitable for incorporation in augmented reality glasses have a maximum modulation rate that can limit the product of resolution and frame rate.

SUMMARY OF THE INVENTION

Conventional scanning image displays in a wearable device for virtual reality or augmented reality applications often have a limited field of view, because the scanning mirror has limited range of scan motion and design constraints in the arrangement of optical elements. Embodiments of the present invention provide scanning image display systems with large field of view and high resolution while maintaining a small device form factor. In some embodiments, the larger field of view can be achieved by scanning multiple incoming light beams at the same time and combining the individual fields of view into a larger, composite field of view.

According to some embodiments of the invention, augmented reality glasses can include a first laser, a second laser, and a scanning mirror. The augmented reality glasses can also include a first polarization selective reflector and a second polarization selective reflector. The first polarization selective reflector is arranged to receive light from the first laser and reflect light received from the first laser at a first angle to the scanning mirror, and the second polarization selective reflector is arranged to receive light from the second laser and reflect light received from the second laser at a second angle to the scanning mirror. The augmented reality glasses can also have an eyepiece having an input coupling port arranged to receive light reflected by the scanning mirror.

In some embodiments of the above augmented reality glasses, the first laser is configured to emit light having a first polarization state, and the second laser is configured to emit light having a second polarization state. The first polarization selective reflector is configured to reflect light of the first polarization state, and the second polarization selective reflector is configured to reflect light of the second polarization state. The first polarization state can be either p-polarization or s-polarization.

In some embodiments, the augmented reality glasses can also have a first wave plate positioned along a first optical path between the first polarization selective reflector and the second polarization selective reflector. In some embodiments, the first wave plate can include a half wave plate.

In some embodiments, the first optical path includes the scanning mirror. In other embodiments, the first optical path does not include the scanning mirror.

In some embodiments, the augmented reality glasses can have a prism wherein the first polarization selective reflector, the second polarization selective reflector and the first wave plate are embedded in the prism.

In some embodiments, the augmented reality glasses can have a second wave plate positioned along a second optical path between the first polarization selective reflector and the second polarization selective reflector. In some embodiments, the second optical path includes the scanning mirror.

In some embodiments, the scanning mirror can include a two axis scanning mirror.

In some embodiments, the first laser is arranged to emit light in a first direction and the second laser is arranged to emit light in a second direction.

In some embodiments, the augmented reality glasses can further have a third laser and a fourth laser. The augmented reality glasses can also have a third polarization selective reflector arranged to receive light from the third laser and reflect light received from the third laser at a third angle to the scanning mirror. The augmented reality glasses can also have a fourth polarization selective reflector arranged to receive light from the fourth laser and reflect light received from the fourth laser at a fourth angle to the scanning mirror.

In some embodiments, the third laser is configured to emit light having the first polarization state, and the fourth laser is configured to emit light having the second polarization state. Further, the third polarization selective reflector is configured to reflect light of the first polarization state, and the fourth polarization selective reflector is configured to reflect light of the second polarization state.

In some embodiments, the augmented reality glasses can include a prism wherein the first polarization selective reflector and the second polarization selective reflector are embedded in the prism.

In some embodiments, the eyepiece further includes an orthogonal pupil expander and an exit pupil expander. The input coupling port is configured to direct light to the orthogonal pupil expander and the orthogonal pupil expander is configured to direct light toward the exit pupil expander.

According to some embodiments of the invention, a waveguide display includes a first laser, a second laser, and a scanning mirror. The waveguide display also has a first polarization selective reflector arranged to receive light from the first laser and reflect light received from the first laser at a first angle to the scanning mirror, and a second polarization selective reflector arranged to receive light from the second laser and reflect light received from the second laser at a second angle to the scanning mirror. The waveguide display also includes an eyepiece waveguide having an input coupling port arranged to receive light reflected by the scanning mirror. The light reflected by the scanning mirror passes through at least one of the first polarization selective reflector or the second polarization selective reflector to reach the input coupling port. The eyepiece waveguide is configured to project an image from an output port of the eyepiece waveguide. The image is formed using light emitted from each of the first laser and the second laser to illuminate a portion of a composite field of view (FOV) through the eyepiece waveguide.

In some embodiments, the first and second polarization selective reflectors are configured to reflect light of the same polarization state, and the first laser and the second laser emit light having the same polarization state. In this case, the waveguide display also includes a first wave plate positioned along a first optical path between the first polarization selective reflector and the second polarization selective reflector, and including the scanning mirror. The first wave plate is configured to change the polarization state of a light beam, so that the light beam reflected from the scanning mirror can pass through at least one of the first polarization selective reflector or the second polarization selective reflector to reach the input coupling port of the eyepiece waveguide. In some embodiments, the first wave plate comprises a half wave plate.

In some embodiments, the waveguide display also has a second wave plate positioned along a second optical path between the first polarization selective reflector and the second polarization selective reflector for reducing leakage light reaching the input coupling port of the eyepiece waveguide.

In some embodiments, the first and second polarization selective reflectors are configured to reflect light of different polarization states, and the first laser and the second laser emit light having different polarization states. In this case, the light beams reflected from the scanning mirror are configured to pass through at least one of the first polarization selective reflector or the second polarization selective reflector to reach the input coupling port of the eyepiece waveguide.

In some embodiments, the waveguide display can also have a third laser, a fourth laser, a third polarization selective reflector, and a fourth polarization selective reflector to form portions of the composite field of view (FOV) through the eyepiece waveguide.

According to some embodiments of the invention, a method for displaying an image in a waveguide display includes emitting light from first and second lasers, each of the first and second of lasers having different emission directions. The method also includes receiving light beams from the first laser and reflecting light received from the first laser at a first angle to a scanning mirror using a first polarization selective reflector, and receiving light from the second laser and reflecting light received from the second laser at a second angle to the scanning mirror using a second polarization selective reflector. The method also includes receiving light reflected by the scanning mirror at an input coupling port of an eyepiece waveguide. The method further includes projecting an image from an output port of the eyepiece waveguide. The image is formed using light emitted from each of the first laser and the second laser to illuminate a portion of a composite field of view (FOV) through the eyepiece waveguide. In some embodiments, the light reflected by the scanning mirror passes through at least one of the first polarization selective reflector or the second polarization selective reflector to reach the input coupling port.

In some embodiments, the method can be implemented with the first laser configured to emit light having a first polarization state and the second laser configured to emit light having the first polarization state. Further, the first polarization selective reflector is configured to reflect light of the first polarization state, and the second polarization selective reflector is configured to reflect light of the first polarization state. For these embodiments, a first wave plate is positioned along a first optical path between the first polarization selective reflector and the second polarization selective reflector, and includes the scanning mirror. The first wave plate can be a half wave plate, configured to change the polarization of light beams, so that the light beams reflected from the scanning mirror can pass through at least one of the first polarization selective reflector or the second polarization selective reflector to reach the input coupling port of the eyepiece waveguide.

In alternative embodiments, the first laser is configured to emit light having a first polarization state, and the second laser is configured to emit light having a second polarization state. Further, the first polarization selective reflector is configured to reflect light of the first polarization state, and the second polarization selective reflector is configured to reflect light of the second polarization state. In these embodiments, no wave plate for polarization conversion is needed. The light beams reflected from the scanning mirror can pass through at least one of the first polarization selective reflector or the second polarization selective reflector having different polarization selectivity to reach the input coupling port of the eyepiece waveguide. In an embodiment, the method further includes using a third laser, a fourth laser, a third polarization selective reflector, and a fourth polarization selective reflector to form portions of the composite field of view (FOV) through the eyepiece waveguide.

In some embodiments, the method can include processes involving a third laser, a fourth laser, a third polarization selective reflector, and a fourth polarization selective reflector performing similar functions as the first and second lasers and polarization selective reflectors.

According to some embodiments of the invention, a display system includes a plurality of lasers and a scanning mirror arranged optically downstream from the plurality of lasers. The display system also includes at least one waveguide arranged optically downstream from the scanning mirror and a prism within which a plurality of polarization selective reflectors are embedded. The prism is physically positioned between the scanning mirror and the at least one waveguide. Each of the plurality of polarization selective reflectors is arranged optically downstream from a respective one of the plurality of lasers and optically upstream from the scanning mirror.

Additional features, benefits, and embodiments are described below in the detailed description, figures, and claims.

DETAILED DESCRIPTION OF SPECIFIC EMBODIMENTS

Embodiments of the present invention are directed to image display systems and methods for a wearable device that can provide a larger field of view (FOV) than conventional display systems.

Figure 1:
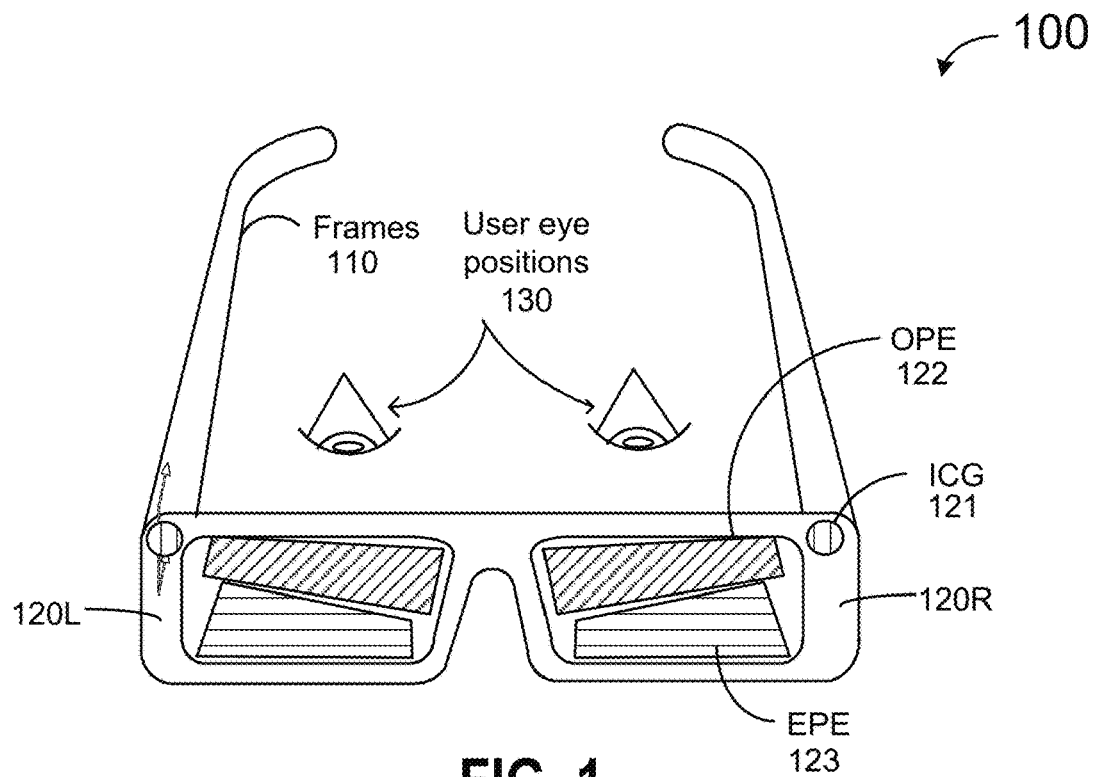
FIG. 1 is a perspective view of exemplary augmented reality glasses according to some embodiments.

FIG. 1 is a perspective view of exemplary augmented reality glasses 100 according to some embodiments. The augmented reality glasses 100, which may also be referred to as a wearable display device, are an example of a wearable device for virtual reality or augmented reality applications. As shown in FIG. 1, augmented reality glasses 100 can include frames 110 supporting a left waveguide eyepiece 120L and a right waveguide eyepiece 120R. Each waveguide eyepiece 120L and 120R can include an input coupling grating (ICG) 121, an orthogonal pupil expander (OPE) 122, and an exit pupil expander (EPE) 123. The input coupling grating is also referred to as the input coupling port. The input coupling grating (ICG) 121, orthogonal pupil expander (OPE) 122, and exit pupil expander (EPE) 123 can be suitable diffractive optical elements (DOEs). For example, they can take the form of gratings formed on an optical waveguide. According to certain embodiments, rather than providing a single waveguide for each eyepiece, each eyepiece can have a stack of multiple optical waveguides, for different colors and with different optical power EPEs. The EPEs are configured to project images that can be viewed from the user eye positions 130.

In some embodiments, the OPE and EPE can be replaced by a combined pupil expander (CPE) that provide the functions of the OPE and the EPE in a combined diffractive structure. As a result, embodiments of the present invention are not limited to the use of separate OPE and EPE elements and may utilize a CPE to both distribute light in the waveguide eyepiece and outcouple light to the user.

In FIG. 1, incoming light, which can be image light or a scanning light beam, can be incident upon the ICG (121) of each eyepiece 120L, 120R. Each ICG 121 couples the incoming light into a guided mode propagating in a direction toward the OPE region 122. The eyepiece propagates the image light by total internal reflection (TIR). The OPE region 122 of each eyepiece 120L, 120R can also include a diffractive element that couples and redirects a portion of the image light propagating in the eyepiece 120L, 120R toward the EPE region 123. The EPE region 123 includes a diffractive element that couples and directs a portion of the light propagating in each eyepiece 120L, 120R in a direction outward from the plane of the eyepiece layer 120 toward viewer's eye positions 130. In this fashion, an image may be viewed by the viewer.

The incoming light may include light in the three primary colors, namely blue (B), green (G), and red (R).

In some applications, the eyepiece can accept collimated light that is scanned in two degrees of freedom. Each instantaneous angle of incidence (or small range of angle of incidence) corresponds to an angularly defined pixel. In some embodiments, the light can be configured to simulate a virtual object, which can appear to be some distance, e.g., half a meter to a meter, away from the viewer.

Figure 2:
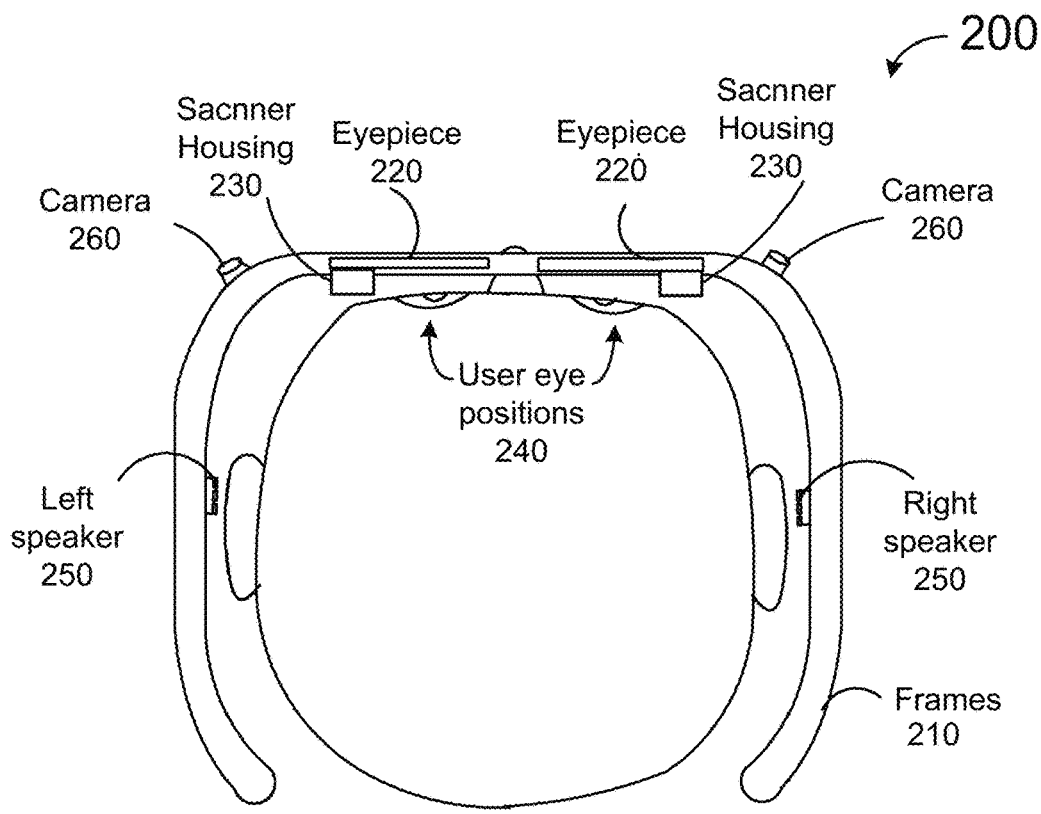
FIG. 2 is a top view of exemplary augmented reality glasses according to some embodiments.

FIG. 2 is a top view of exemplary augmented reality glasses 200 according to some embodiments. The augmented reality glasses 200, which can also be referred to as a wearable display device, are an example of a wearable device for virtual reality or augmented reality applications. As shown in FIG. 2, wearable display device 200 can include frames 210 and eyepieces 220. Each eyepiece can be similar to eyepieces 120L, 120R in FIG. 1 and can include an ICG, an OPE, and an EPE, which are not visible in the top view. Augmented reality glasses 200 can also include scanner housings 230, which can include a scanning mirror for forming a virtual image (e.g., at infinity) from incoming light sources. In some embodiments, the ICGs are used as input ports for receiving light. The images formed by the eyepiece can be viewed from user eye positions 240. The augmented reality glasses can also have left and right speakers 250 and cameras 260.

Figure 3:
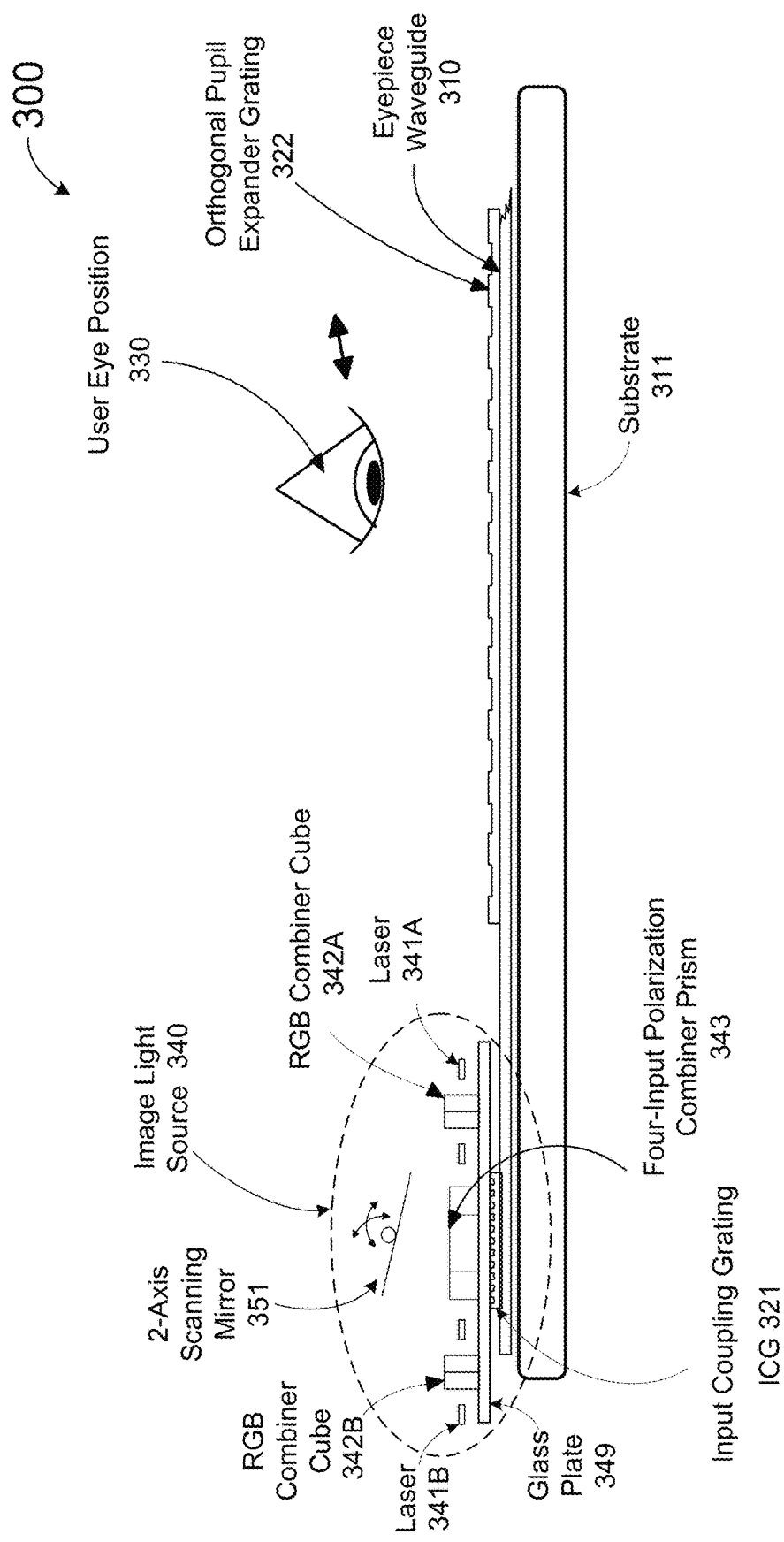
FIG. 3 is a cross-sectional view of a waveguide display according to some embodiments.
Figure 4:
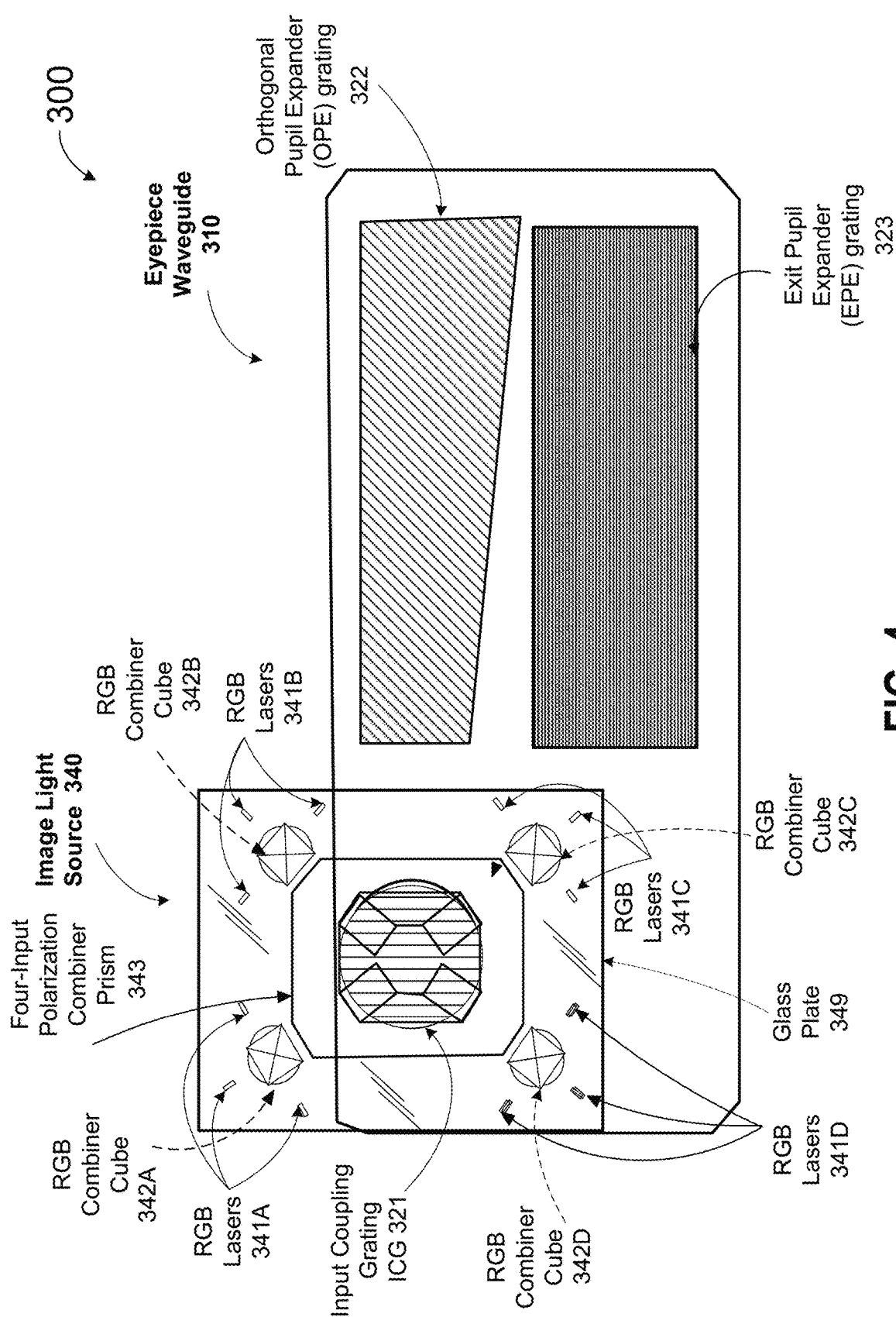
FIG. 4 is a top view of the waveguide display of FIG. 3 according to some embodiments.

FIG. 3 is a cross-sectional view and FIG. 4 is a top view of a waveguide display 300 according to some embodiments. As illustrated in FIGS. 3 and 4, waveguide display 300 can include an eyepiece waveguide 310 on a substrate 311, which can be used as eyepiece 120L, 120R, or 220 of the augmented reality glasses illustrated in FIG. 1 or 2. For example, the substrate 311 can be a glass slab. The substrate can also be made with other materials, such as a polymer material or a semiconductor material, etc. An optical waveguide is an elongated structure configured for guiding light by restricting the spatial region in which light can propagate.

Eyepiece waveguide 310 can have an input coupling grating (ICG) 321, an orthogonal pupil expander (OPE) 322, and an exit pupil expander (EPE) 323. Exit pupil expander (EPE) 323 is visible in FIG. 4, but not in FIG. 3. The input coupling grating (ICG) 321, orthogonal pupil expander (OPE) 322, and exit pupil expander (EPE) 323 can take the form of gratings formed on the optical waveguide. Each eyepiece can have a stack of multiple optical waveguides for different colors and with different optical power EPEs. The EPEs are configured to project images that can be viewed from the user eye positions 330.

As discussed above, in some embodiments, the OPE and EPE can be replaced by a combined pupil expander (CPE) that provide the functions of the OPE and the EPE in a combined diffractive structure. As a result, embodiments of the present invention are not limited to the use of separate OPE and EPE elements and may utilize a CPE to both distribute light in the waveguide eyepiece and outcouple light to the user.

In some embodiments, eyepiece waveguide 310 in waveguide display 300 can have input ports, configured to receive beams of light at differing angles. In FIG. 3A, the input ports are shown as input coupling grating (ICG) 321. A plurality of image light beams can be provided by an image light source 340. Image light source 340 can have multiple sets of RGB lasers, e.g., laser diodes. The red, green, and blue light from each set of RGB laser diodes can be combined in a combiner cube, and a multiple-input polarization combiner prism can direct light beams from the combiners towards a scanning mirror at different angles. The light beams reflected from the mirror are configured to scan different portions of an intended field of view (FOV). As a result of image stitching, a wider field of view (FOV) can be achieved.

In the embodiments shown in FIG. 4, image light source 340 has four sets of red, green, and blue (RGB) laser diodes 341A, 341B, 341C, 341D, including a first set of RGB laser diodes 341A, a second set of RGB laser diodes 341B, a third set of RGB laser diodes 341C, and a fourth set of RGB laser diodes 341D. The light beams from each of the four sets of red, green, and blue (RGB) laser diodes 341A, 341B, 341C, 341D are input to RGB combiner cubes 342A, 342B, 342C, and 342D, respectively. Light beams from RGB combiner cubes 342A, 342B, 342C, and 342D are coupled into a four-input polarization combiner prism 343 that directs light beams from the combiners towards a scanning mirror 351.

In FIG. 3, a 2-axis scanning mirror 351 is shown to be disposed over the four-input polarization combiner prism 343. In the cross-sectional view of FIG. 3, only two of the lasers are visible, e.g., 341A and 341B, and only two of the RGB combiner cubes are visible, e.g., 342A and 342B. The four-input polarization combiner prism 343 receives light beams from four RGB laser sources and directs four light beams to the scanning mirror 351 in four different directions. The reflected light beams from the scanning mirror 351 pass through the polarization combiner prism 343 to reach the ICG 321. The four reflected beams propagate along directions of angularly separated vectors. The angular ranges of the four reflected light beams are configured to span four quadrants of a composite field of view.

In some embodiments, such as shown in FIG. 3, various components of image light source 340 can be disposed on a glass plate 349. Image light source 340 can be disposed immediately above ICG 321, and scanning mirror 351 can be disposed at a short distance above image light source 340, such that scanning mirror 351 is disposed proximate the input port (ICG 321).

In FIG. 3, scanning mirror 351 can be a two-dimensional scanning mirror. The mirror can be configured to rotate in the pitch and roll directions, forming a 2-D scanner. In some embodiments, the mirror can have an outer frame with outer pivot points, and an inner frame with a second set of pivot points. The driving mechanism is not shown explicitly in FIG. 3. For example, the scanning mirror 351 can be driven by electromagnetic force, for example, by a coil in a magnetic field, or by interdigitated finger Microelectromechanical System (MEMS) electrostatic drives.

Figure 5:
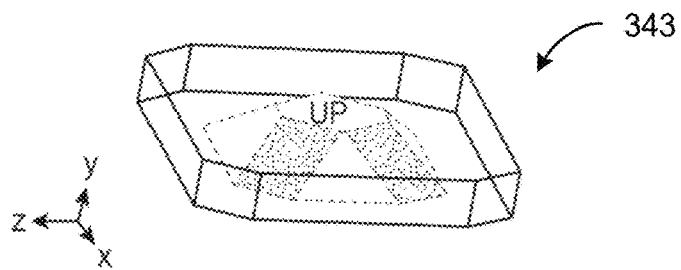
FIG. 5 is a top perspective view of the four-input polarization combiner prism in FIGS. 3 and 4 according to some embodiments.
Figure 6:
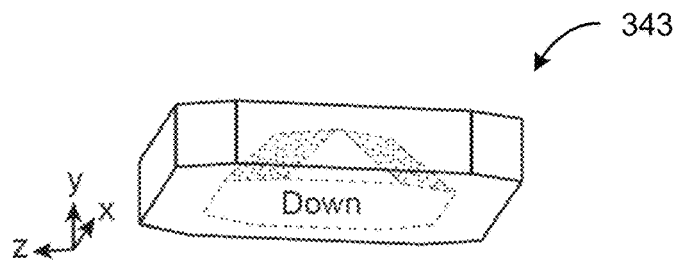
FIG. 6 is a bottom perspective view of the four-input polarization combiner prism of FIG. 5.
Figure 7A:
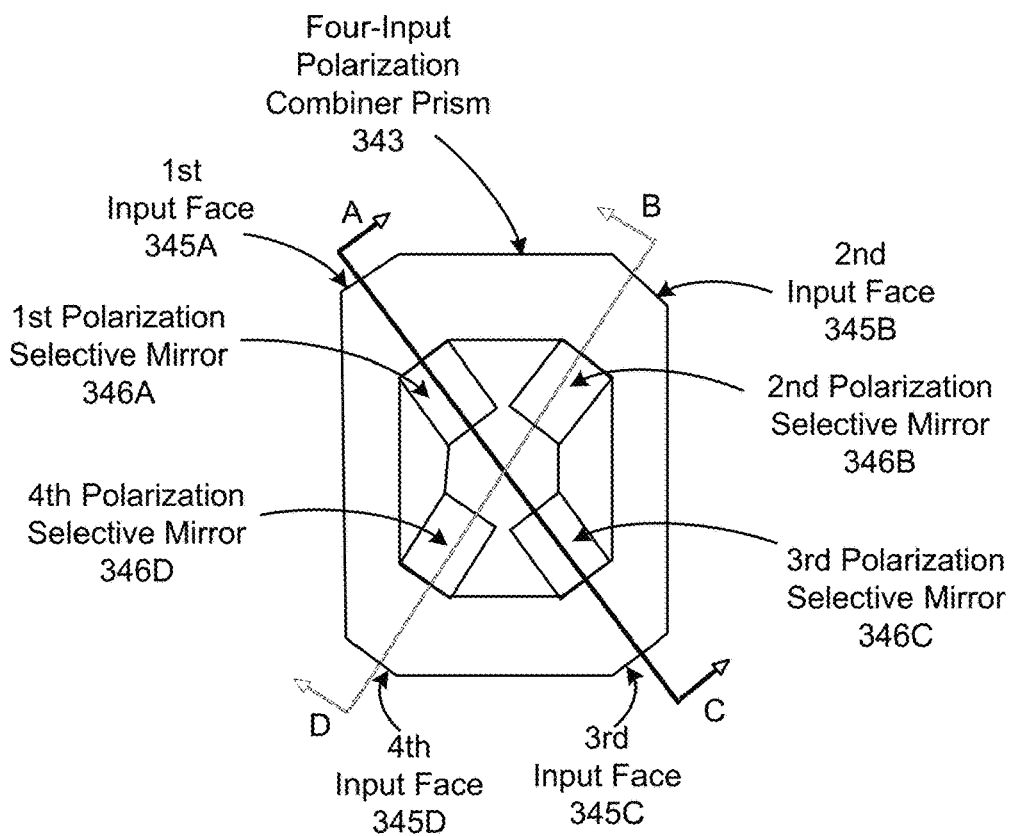
FIG. 7A is a top schematic view of the four-input polarization combiner prism of FIG. 5 according to some embodiments.

FIG. 5 is a top perspective view of the four-input polarization combiner prism 343 shown in FIGS. 3 and 4. FIG. 6 is a bottom perspective view of the four-input polarization combiner prism 343 shown in FIGS. 3 and 4. FIG. 7A is a top schematic view of the four-input polarization combiner prism 343. The four-input polarization combiner prism 343 can be made of suitable optical materials, such as glass or plastic. In the embodiment shown in FIG. 7A, the four-input polarization combiner prism 343 has an octagonal shape and can have a first input face 345A, a second input face 345B, a third input face 345C, and a fourth input face 345D. The four-input polarization combiner prism 343 can also have a first polarization selective mirror 346A, a second polarization selective mirror 346B, a third input polarization selective mirror 346C, and a fourth input polarization selective mirror 346D.

A polarization selective mirror, also referred to as a polarization selective reflector, allows light in one polarization (e.g., p-polarization) to pass through unhindered while it reflects light in the orthogonal (e.g., s-polarization) polarization. The polarization selective mirrors can be made of thin films or coatings of appropriate polarizing materials or wire-grid polarizers, etc. In some embodiments, the polarization selective mirrors or reflectors may take the form of polarizing beam splitters. The functions of the four-input polarization combiner prism 343 are described with reference to FIG. 7B.

Figure 7B:
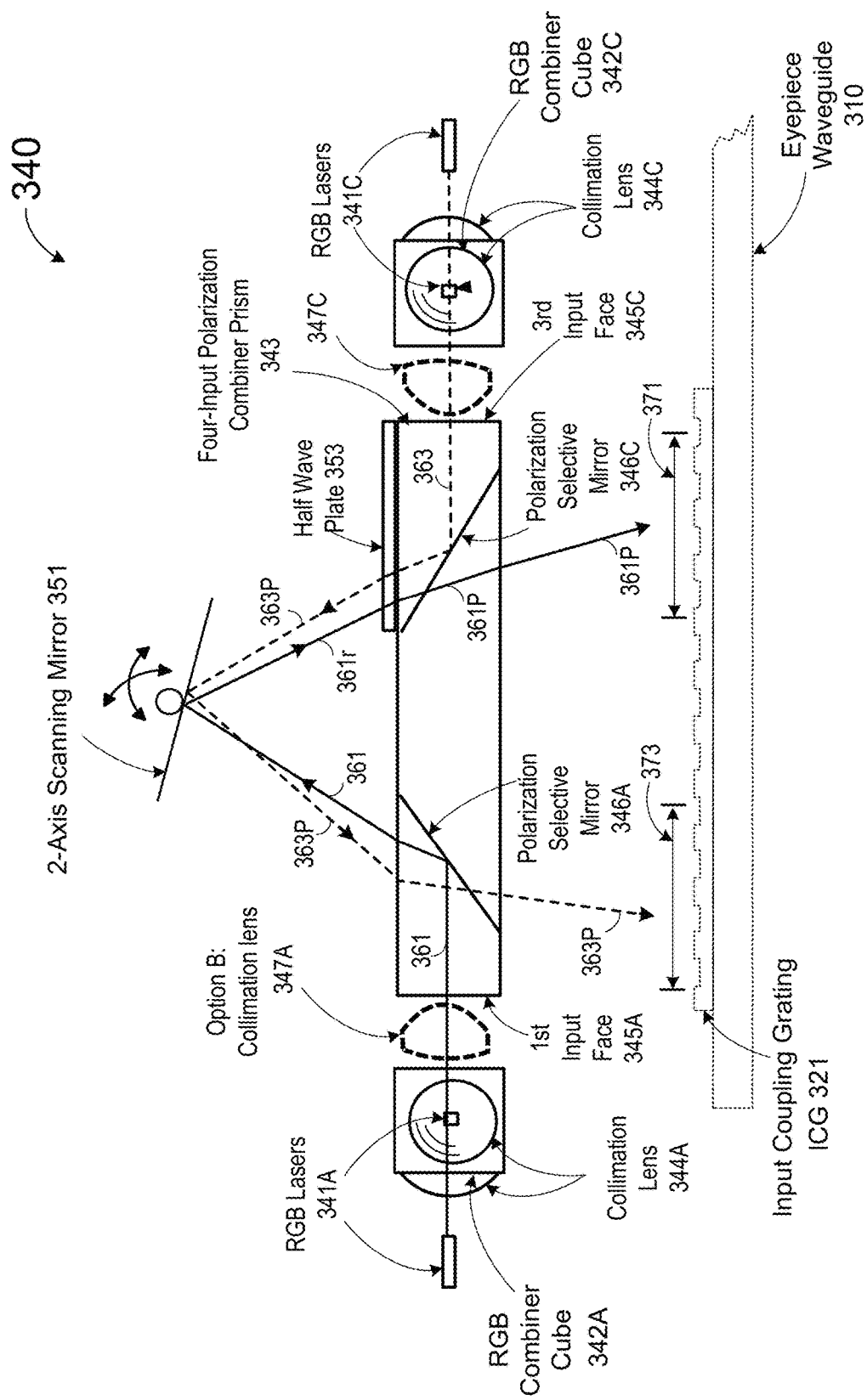
FIG. 7B is a cross-sectional view of the image light source in FIGS. 3 and 4 along the cut line A-C shown in FIG. 7A according to some embodiments.

FIG. 7B is a cross-sectional view of image light source 340 in FIGS. 3 and 4 along the cut line A-C shown in FIG. 7A. FIG. 7B shows four-input polarization combiner prism 343, RGB laser diodes 341A and RGB combiner cube 342A disposed to the left of the four-input polarization combiner prism 343, and RGB lasers 341C and RGB combiner cube 342C disposed to the right of the four-input polarization combiner prism 343. A 2-axis scanning mirror 351 is disposed above the four-input polarization combiner prism 343. A half wave plate 353 is disposed above the four-input polarization combiner prism 343. Below the four-input polarization combiner prism 343, input coupling grating (ICG) 321 and eyepiece waveguide 310 are shown in dotted lines for description reference.

RGB lasers 341A and RGB combiner cube 342A are configured to provide a first collimated light beam 361 to the first input faces 345A of the four-input polarization combiner prism 343. In some embodiments, three collimation lenses 344A can be disposed adjacent to RGB combiner cube 342A to collimate the red, green, and blue lasers 341A, separately. Alternatively, shown in dotted lines as Option B in FIG. 7B, a single collimation lens 347A can be disposed between RGB combiner cube 342A and the first input face 345A of the four-input polarization combiner prism 343 to collimate the combined uncollimated output light beams from RGB combiner cube 342A to provide the collimated light beam 361.

Similarly, RGB lasers 341C and RGB combiner cube 342C are configured to provide a third collimated light beam 363 to the third input face 345C of the four-input polarization combiner prism 343. Three collimation lenses 344C can be disposed adjacent to RGB combiner cube 342C to collimate the red, green, and blue lasers 341C. Alternatively, shown in dotted lines in FIG. 7B, a single collimation lens 347C can be disposed between RGB combiner cube 342C and the third input face 345C of the four-input polarization combiner prism 343 to collimate the combined output light beam from RGB combiner cube 342C to provide collimated light beam 363.

In some embodiments, the first polarization selective mirror 346A and the third polarization selective mirror 346C have the same polarization selectivity; for example, both can reflect light beams of p-polarization, or both can reflect light beams of s-polarization. In order to allow the light beams reflected from the 2-axis scanning mirror 351 to pass through the polarization selective mirrors to reach the input coupling grating 321, the half wave plate 353 is disposed along the optical path to change the polarization states of the light beams. As shown in FIG. 7B, the half wave plate 353 is disposed above the four-input polarization combiner prism 343 adjacent to the third input face 345C.

The first collimated light beam 361 from the first RGB combiner cube 342A enters the first input face 345A of the four-input polarization combiner prism 343 and is reflected by the first polarization selective mirror 346A to the scanning mirror 351, which scans the first reflected light beam 361r. The first reflected light beam 361r passes through half wave plate 353 and becomes light beam 361P having a different polarization, which enables light beam 361P to pass through the third polarization selective mirror 346C to reach input coupling grating (ICG) 321. The light beam from the scanning mirror is incoupled by the ICG 321 into eyepiece waveguide 310. Eyepiece waveguide 310 can have a stack of multiple optical waveguides for different colors. Incoupled light propagates in eyepiece waveguide 310 by total internal reflection, and then outcoupled to orthogonal pupil expander 322, and in turn is coupled to exit pupil expanders (EPEs) 323. The EPEs are configured to project images that can be viewed from the user eye positions 330 in FIG. 3. Due to the scanning motion of 2-axis scanning mirror 351, light beam 361P can have a scan range 371 when it enters input coupling grating 321 to be coupled into eyepiece waveguide 310 and ultimately produce an image in a first quadrant of the field of view.

The third collimated light beam 363 from the third RGB combiner cube 342C enters the third input face 345C of the four-input polarization combiner prism 343 and is reflected by the third polarization selective mirror 346C towards the scanning mirror 351. After passing through half wave plate 353, third collimated light beam 363 becomes light beam 363P having a different polarization. Light beam 363P reaches the two-axis scanning mirror 351 and is reflected towards the left side of the four-input polarization combiner prism 343. The polarization of reflected light beam 363P enables light beam 363P to pass through the first polarization selective mirror 346A to reach input coupling grating 321. Due to the scanning motion of two-axis scanning mirror 351, light beam 363P can have a scan range 373 when it enters input coupling grating 321 to be coupled into eyepiece waveguide 310, and ultimately produce an image in a third quadrant of the field of view.

Figure 9:
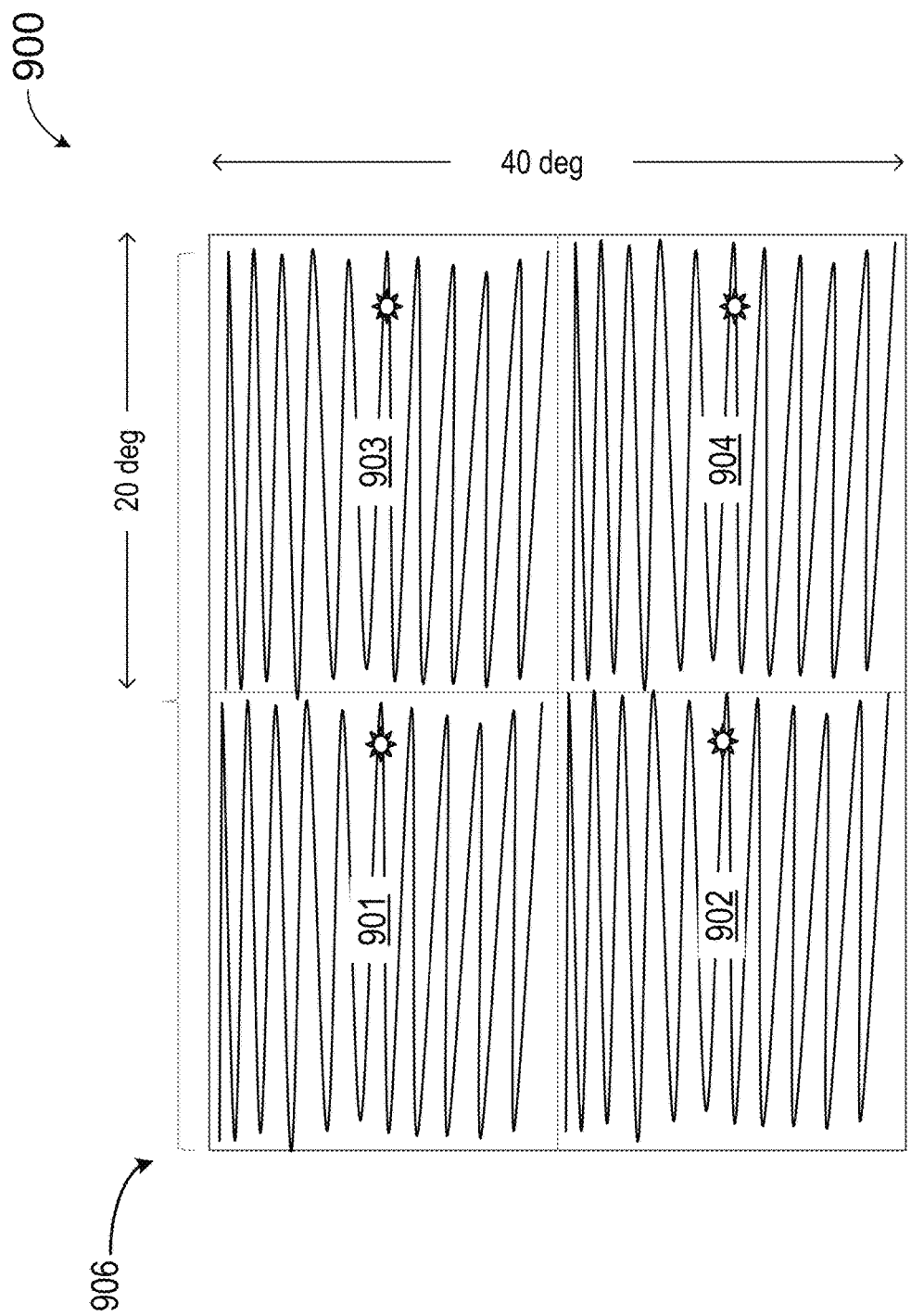
FIG. 9 is a simplified schematic diagram illustrating a composite field of view (FOV) according to some embodiments of the invention.

As described above, images in the first and third quadrants of the field of view can be produced by actions of light beams along the cut line A-C in FIG. 7A. In a similar fashion, images in the second and fourth quadrants of the field of view can be produced by actions of light beams along the cut line B-D in FIG. 7A. Due to the scanning motion of 2-axis scanning mirror 351, a light beam from RGB lasers 341B in FIG. 4 can be reflected by the second polarization selective mirror 346B and then by the 2-axis scanning mirror 351 to have a scan range when it enters input coupling grating 321 to be coupled into eyepiece waveguide 310 and ultimately produce an image in a second quadrant of the field of view. Similarly, a light beam from RGB lasers 341D in FIG. 4 can be reflected by the fourth polarization selective mirror 346D and then by the 2-axis scanning mirror 351 to have a scan range when it enters input coupling grating 321 to be coupled into eyepiece waveguide 310 and ultimately produce an image in a fourth quadrant of the field of view. The combination of the four scanning light beams is configured to provide a tiled image with four quadrants in the field of view, as illustrated in FIG. 9.

Figure 8A:
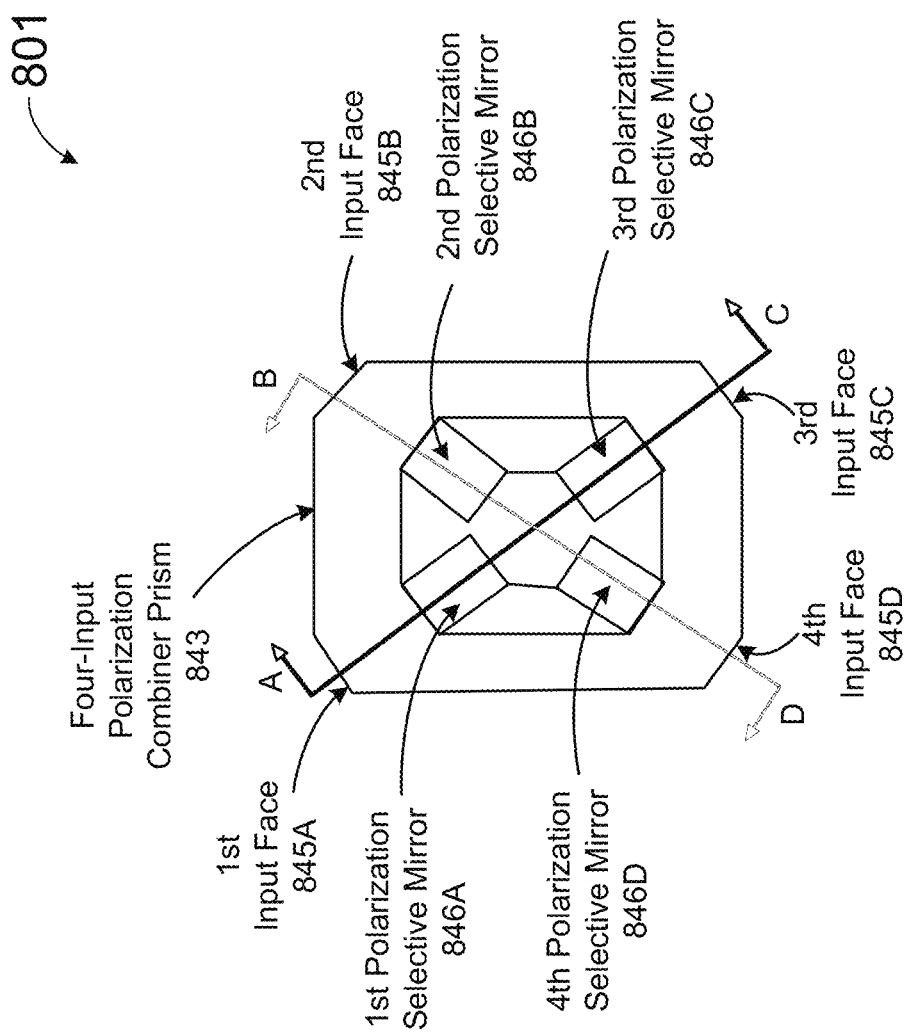
FIG. 8A illustrates a top schematic view of a four-input polarization combiner prism according to alternative embodiments of the invention.
Figure 8B:
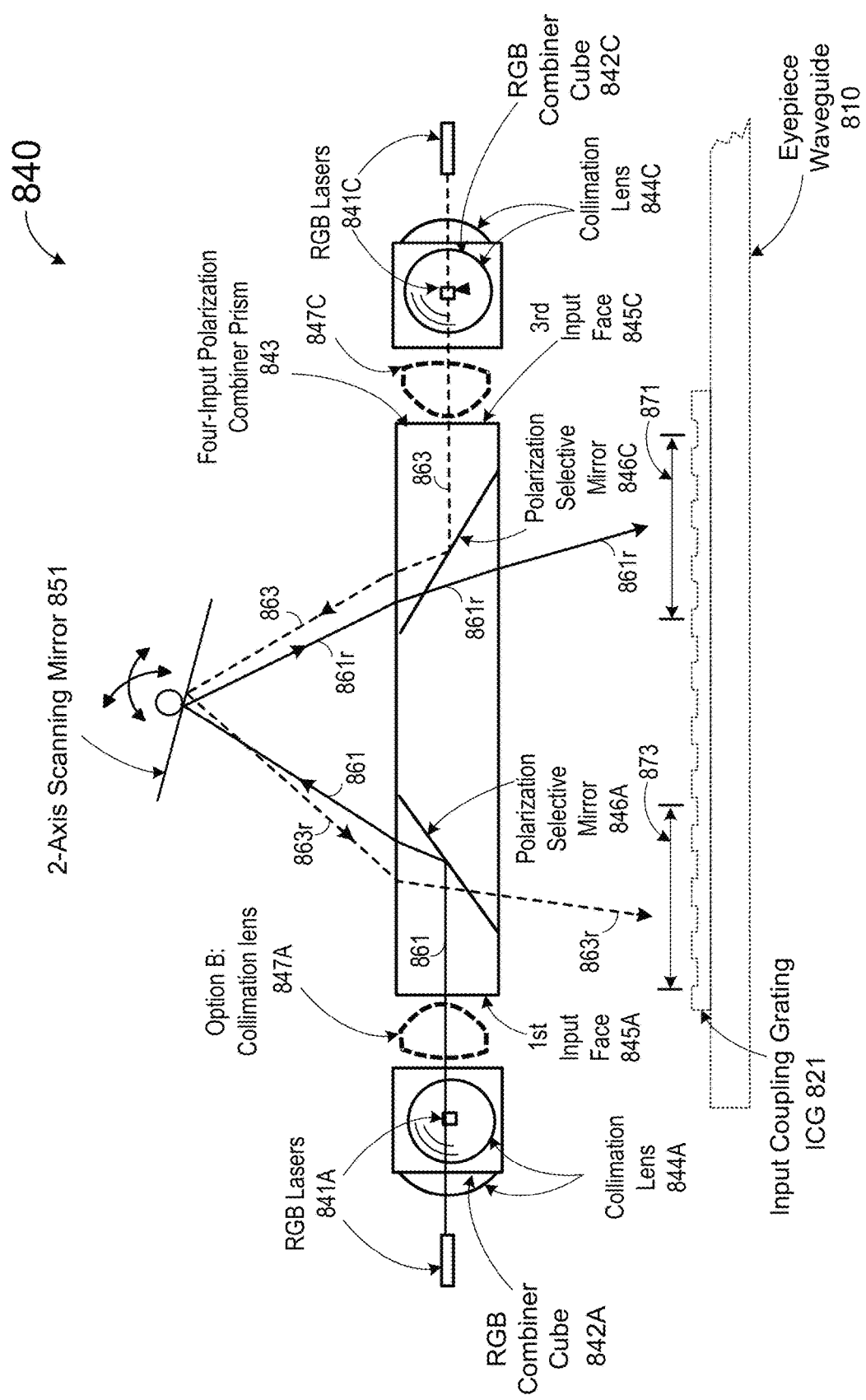
FIG. 8B is a cross-sectional view of an image light source according to alternative embodiments of the invention.

FIG. 8A illustrates a top schematic view of a four-input polarization combiner prism according to alternative embodiments of the invention. FIG. 8B is a cross-sectional view of an image light source according to alternative embodiments of the invention. Four-input polarization combiner prism 843 in FIG. 8A is similar to four-input polarization combiner prism 343, and image light source 840 in FIG. 8B is similar to image light source 340 in FIG. 7B. In the embodiments illustrated in FIGS. 7A and 7B, the first polarization selective mirror 346A and the third polarization selective mirror 346C have the same polarization selectivity, for example, both can reflect light beams of p-polarization, or both can reflect light beams of s-polarization. In order to allow the light beams reflected from the 2-axis scanning mirror 351 to pass through the polarization selective mirrors to reach the input coupling grating 321, the half wave plate 353 is disposed along the optical path to change the polarization states of the light beams. As shown in FIG. 7B, the half wave plate 353 is disposed above the four-input polarization combiner prism 343. On the other hand, in the embodiments illustrated in FIGS. 8A and 8B, the polarization selective mirrors along a diagonal line in the four-input polarization combiner prism have opposite polarization selectivity. In this arrangement, the light beams reflected from the 2-axis scanning mirror 351 can pass through the polarization selective mirrors to reach the input coupling grating 321 without changing their polarization states. Therefore, no half wave plate is needed along the optical path to change the polarization states of the light beams.

FIG. 8A shows a top schematic view 801 of a four-input polarization combiner prism 843. The four-input polarization combiner prism 843 can be made of suitable optical materials. In the embodiment shown in FIG. 8A, the four-input polarization combiner prism 843 has an octagonal shape and can have a first input face 845A, a second input face 845B, a third input face 845C, and a fourth input face 845D. The four-input polarization combiner prism 843 can also have a first polarization selective mirror 846A, a second polarization selective mirror 846B, a third input polarization selective mirror 846C, and a fourth input polarization selective mirror 846D. As shown in FIG. 8A, first polarization selective mirror 846A and second polarization selective mirror 846B have the same polarization selectivity, e.g., both 846A and 846B reflect light beams of p-polarization. Third polarization selective mirror 846C and fourth polarization selective mirror 846D have the same polarization selectivity, e.g., both 846D and 846D reflect light beams of s-polarization. The functions of the four-input polarization combiner prism 843 are described in connection with FIG. 8B.

FIG. 8B is a cross-sectional view of image light source 840 along the cut line A-C shown in FIG. 8A. Image light source 840 is an alternative light source that can be used in FIGS. 3 and 4. FIG. 8B shows four-input polarization combiner prism 843, RGB lasers 841A and RGB combiner cube 842A disposed to the left of the four-input polarization combiner prism 848, and RGB lasers 841C and RGB combiner cube 842C disposed to the right of the four-input polarization combiner prism 843. 2-axis scanning mirror 851 is disposed above the four-input polarization combiner prism 843. Below the four-input polarization combiner prism 843, input coupling grating (ICG) 821 and eyepiece waveguide 810 are shown in dotted lines for description reference.

RGB lasers 841A and RGB combiner cube 842A are configured to provide a first collimated light beam 861 to the first input faces 845A of the four-input polarization combiner prism 843. Three collimation lenses 844A can be disposed adjacent to RGB combiner cube 842A to collimate the red, green, and blue lasers 841A. Alternatively, shown in dotted lines as Option B in FIG. 8B, a single collimation lens 847A can be disposed between RGB combiner cube 842A and the first input faces 845A of the four-input polarization combiner prism 843 to collimate the combined output light beam from RGB combiner cube 842A to provide the first collimated light beam 861.

Similarly, RGB lasers 841C and RGB combiner cube 842C are configured to provide a third collimated light beam 863 to the third input face 845C of the four-input polarization combiner prism 843. Three collimation lenses 844C can be disposed adjacent to RGB combiner cube 842C to collimate the red, green, and blue lasers 841C. Alternatively, shown in dotted lines in FIG. 8B, a single collimation lens 847C can be disposed between RGB combiner cube 842C and the third input face 845C of the four-input polarization combiner prism 843 to collimate the combined output light beam from RGB combiner cube 842C to provide collimated light beam 863.

In some embodiments, the first polarization selective mirror 846A and the third polarization selective mirror 846C have opposite polarization selectivity. For example, the first polarization selective mirror 846A can reflect light beams of p-polarization, and the third polarization selective mirror 846C can reflect light beams of s-polarization. In this arrangement, the light beams reflected from the 2-axis scanning mirror 851 can pass through the polarization selective mirrors to reach the input coupling grating 821, without a half wave plate disposed along the optical path to change the polarization states of the light beams.

As shown in FIG. 8B, a first collimated light beam 861 from the first RGB combiner cube 842A enters the first input face 845A of the four-input polarization combiner prism 843 and is reflected by the first polarization selective mirror 846A to the scanning mirror 851, which scans the first reflected light beam 861r. The first reflected light beam 861r has a different polarization than the third collimated light beam 863, which enables first reflected light beam 861r to pass through the third polarization selective mirror 846C to reach input coupling grating 821. The light beam from the scanning mirror is incoupled by the ICG 821 into eyepiece waveguide 810. Eyepiece waveguide 810 can have a stack of multiple optical waveguides for different colors. Incoupled light propagates in eyepiece waveguide 810 by total internal reflection, and is then outcoupled to an orthogonal pupil expander, and in turn coupled to one or more exit pupil expanders (EPEs). The EPEs are configured to project images that can be viewed from the user eye positions 330 as shown in FIG. 3. Due to the scanning motion of 2-axis scanning mirror 851, first reflected light beam 861r can have a scan range 871 when it enters input coupling grating 821 to be coupled into eyepiece waveguide 810 and ultimately produce an image in a first quadrant of the field of view.

The third collimated light beam 863 from the third RGB combiner cube 842C enters the third input face 845C of the four-input polarization combiner prism 843 and is reflected by the third polarization selective mirror 846C towards the scanning mirror 851. Third collimated light beam 863 reaches the two-axis scanning mirror 851 and is reflected towards the left side of the four-input polarization combiner prism 843. The polarization of third reflected light beam 863r enables third reflected light beam 863r to pass through the first polarization selective mirror 846A to reach input coupling grating 821. Due to the scanning motion of two-axis scanning mirror 851, third reflected light beam 863r can have a scan range 873 when it enters input coupling grating 821 to be coupled into eyepiece waveguide 810, and ultimately produce an image in a third quadrant of the field of view.

As described above, images in the first and third quadrants of the field of view can be produced by actions of light beams along the cut line A-C in FIG. 8A. In a similar fashion, images in the second and fourth quadrants of the field of view can be produced by actions of light beams along the cut line B-D in FIG. 8A. Due to the scanning motion of 2-axis scanning mirror 851, a second light beam from a second RGB laser can be reflected by the second polarization selective mirror 846B and then by the 2-axis scanning mirror 851 to have a scan range when it enters input coupling grating 821 to be coupled into eyepiece waveguide 810 and ultimately produce an image in a second quadrant of the field of view. Similarly, a light beam from a third RGB laser can be reflected by the fourth polarization selective mirror 846D and then by the 2-axis scanning mirror 851 to have a scan range when it enters input coupling grating 821 to be coupled into eyepiece waveguide 810 and ultimately produce an image in a fourth quadrant of the field of view. The combination of the four scanning light beams is configured to provide a tiled image with four quadrants in the field of view, as illustrated in FIG. 9.

FIG. 9 is a simplified schematic diagram 900 illustrating a composite field of view (FOV) according to some embodiments. As described in FIGS. 3-8B, four light beams can be incident on the scanning mirror. The mirror outputs four collimated beams heading in different directions. With the mirror scanning, it can form images in the four quarters of the field of view. At any instant of time, each of the four light beams is directed at a different angle. In this example, a full image is scanned concurrently (e.g., simultaneously) by four RGB beams in four quadrants of the field of view. The combination of the four scanning light beams is configured to provide a tiled image with four quadrants, 901-904, in an enlarged composite field of view 906 in FIG. 9.

For example, in some embodiments, each quadrant can be a VGA (Video Graphics Array) image, but the total stitched image in the composite FOV can be full HD (High Definition) with an enlarged field of view. With reference to FIG. 3, 2-axis scanning mirror 351, which may be a MEMS reflector/scanner, may have a 20×20 degrees optical scan range (corresponding to a 10×10 mechanical scan range). Diagonally opposite pairs of the polarization selective mirror (e.g., 346A and 346C; and 346B and 346D) can be angularly separated by 20 degree angle theta θ (VGA resolution) as judged from the center of the scanning mirror 351. Light beams 361 and 363 from the image light source 340 reach scanning mirror 351. Each of the light beams 361 and 363 can have a different chief ray direction. The scanning mirror 351 reflects collimated light beams to ICG 321. ICG 321 is configured to incouple collimated light beams into eyepiece waveguide 310. After total internal reflection in the eyepiece waveguide 310, each of the collimated light beams 361 and 363 forms a scanned image in a respective field of view.

For example, in some embodiments, waveguide display 300, with four light beams, can provide a resulting scan image with 2× field of view (40×40 degrees) and resolution, commensurate with an HD, 40×40 degrees requirement (for example, a pixel angular subtense of less than 1 arc minutes). Moreover, the final image can have 50 degrees diagonal for full HD display.

In the examples described above, a single ICG can receive multiple light beams having different directions to form a large field of view. For color displays, different ICGs can be used for different colors. As an example, the input light beams can have a size on the order of 1 mm, and the scanned image can be as large as 6×6 mm or even larger, depending on the distance from the ICG.

In some embodiments, waveguide display 300 can be used with fewer or more than four light sources and a scanning mirror for image generation with a larger composite field of view as described above. A different composite FOV can be formed using different numbers and/or shapes of component FOVs.

Figure 10:
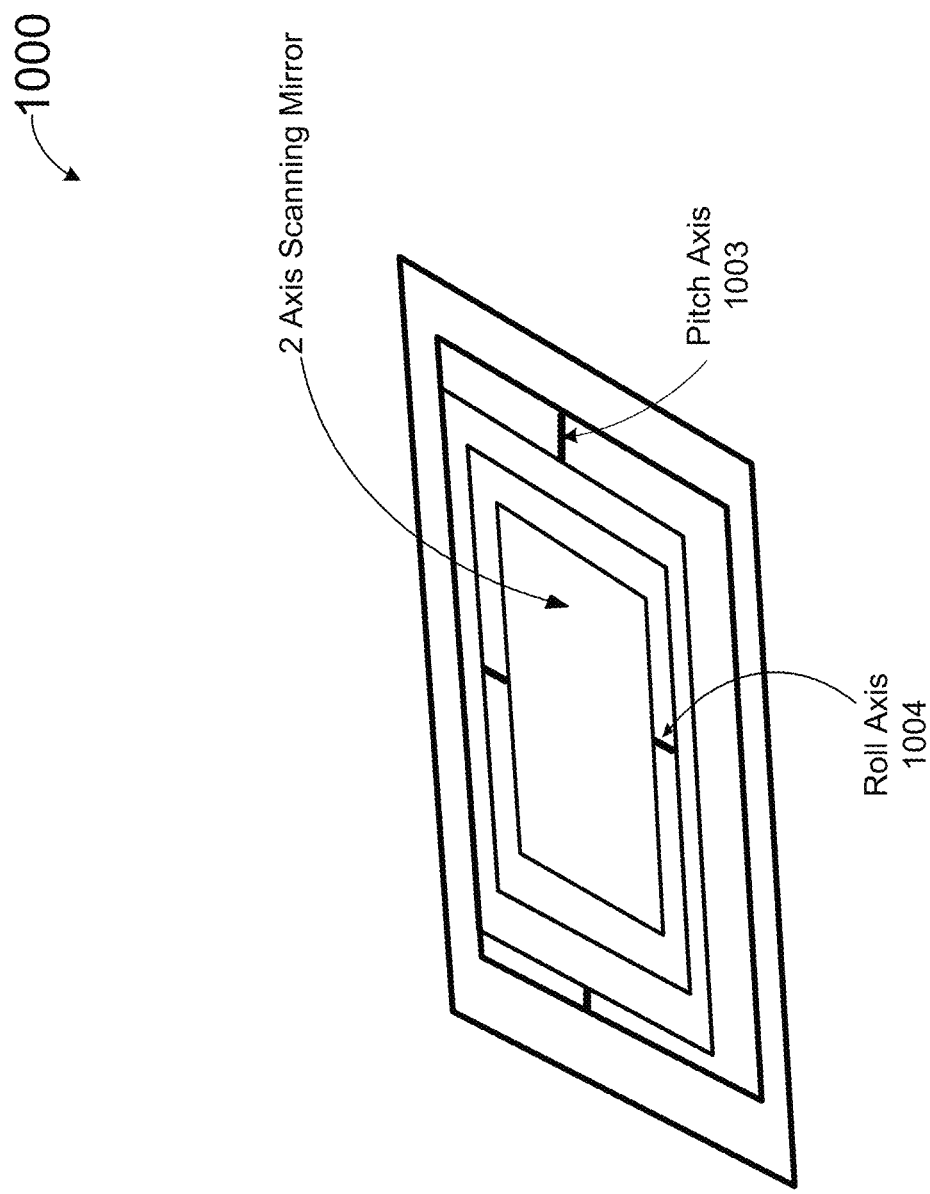
FIG. 10 is a perspective view of a 2-axis scanning mirror according to some embodiments.

FIG. 10 is a perspective view of a 2-axis scanning mirror 1000 that can be used as the 2-axis scanning mirror 351 in waveguide display 300 shown in FIG. 3 and as the 2-axis scanning mirror 851 in image light source 840 shown in FIG. 8B. 2-axis scanning mirror 1000 can be a two-dimensional scanning mirror, configured to rotate in two dimensions with a pitch axis 1003 and a roll axis 1004. In FIGS. 3 and 8B, the scanning mirror 351 and the scanning mirror 851 is positioned above the four-input polarization combiner prism 343 and the four-input polarization combiner prism 843 and configured to intercept light emitted by the RGB lasers and reflected by the polarization selective mirrors.

The scanning mirror movement may be resonant in one degree of freedom and quasi-statically controlled in a second degree of freedom. For example, the resonant axis may correspond to a movement analogous to movement along lines of a display and the quasi-statically controlled second degree of freedom may correspond to movement analogous to vertical movement between lines of a display. In one possible case, the resonant axis may be the pitch axis and the quasi-statically controlled axis may be the yaw axis. For relatively high resolution imagery, it is desirable to have the equivalent of 1000 or 2000 scan lines, for example, and a frame refresh rate of 30 to 60 frames per second. Such parameters call for a line rate of 30 KHz to 120 KHz. For small MEMS scanners that are small enough to be included in augmented reality wearables, there is generally a tradeoff between the angular range of the resonant axis, which relates to the field of view (FOV), and the resonant frequency, which equates to the line rate.

Figure 11:
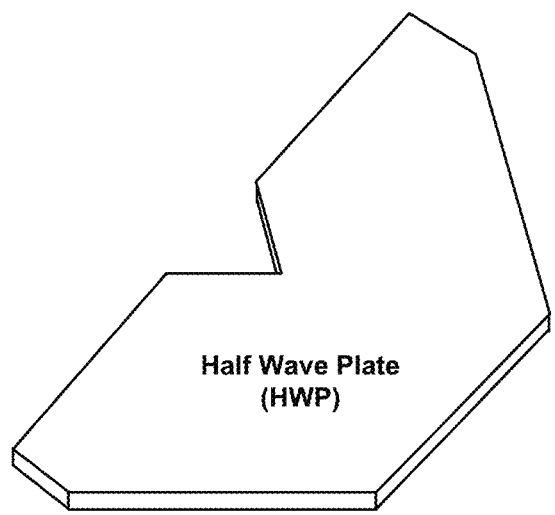
FIG. 11 is a perspective view of a half wave plate according to some embodiments.

FIG. 11 is a perspective view of a half wave plate according to some embodiments of the invention. A wave plate is an optical device that alters the polarization state of a light wave travelling through it. Two common types of wave plates are the half-wave plate, which shifts the polarization direction of linearly polarized light, and the quarter-wave plate, which converts linearly polarized light into circularly or elliptically polarized light and vice versa. Wave plates can be constructed out of a birefringent material (such as quartz or mica), for which the index of refraction is different for different orientations of light passing through it. The half wave plate in FIG. 11 can have a thickness of half the wavelength of the light used in the device, and is configured to convert p-polarization to s-polarization, and vice versa.

Figure 12:
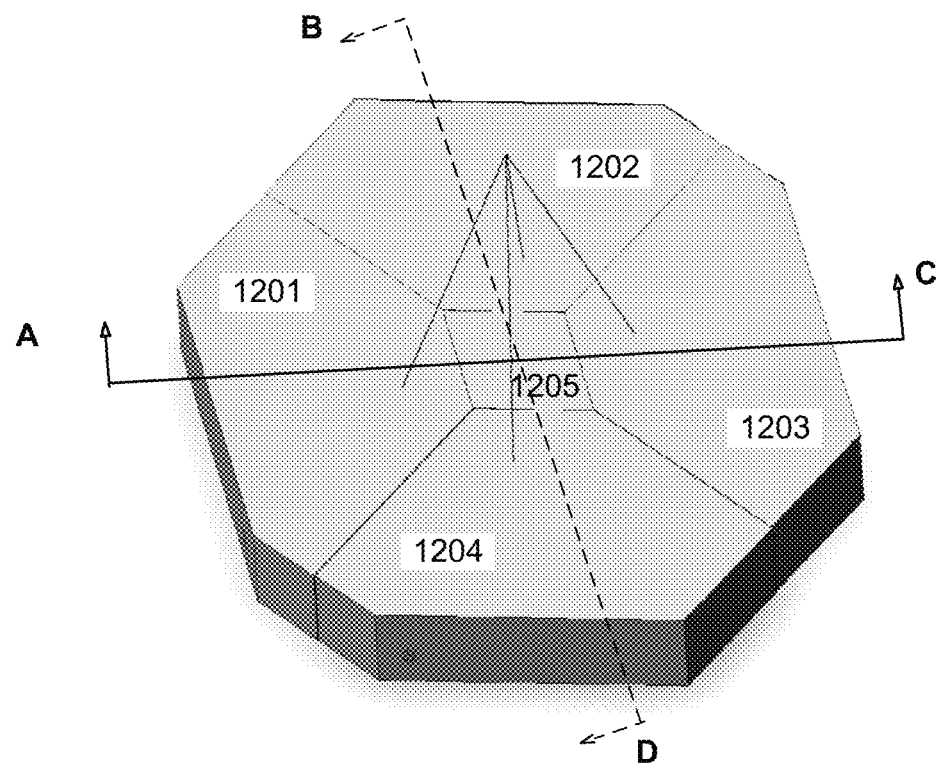
FIG. 12 is a perspective view of a four-input polarization combiner prism according to some embodiments.

FIG. 12 is a perspective view of a four-input polarization combiner prism according to some embodiments. The four-input polarization combiner prism in FIG. 12 can be used as four-input polarization combiner prism 343 in FIGS. 7A and 7B or four-input polarization combiner prism 843 in FIGS. 8A and 8B. The four-input polarization combiner prism can be made out of a glass or other transparent materials, such as plastic materials. The prism can be constructed using multiple segments joined together. FIG. 12 shows four outer segments 1201, 1202, 1203, and 1204, as well as a center segment 1205. Each of the outer segments can have internal facets to allow formation of polarization selective mirrors. Perspective views of the facets can be seen in FIGS. 5 and 6. The polarization selective mirrors can be made of thin films or coatings of appropriate polarizing materials or wire-grid polarizers, etc. In FIG. 12, cut lines A-C and B-D correspond to cut lines A-C and B-D in FIG. 7A. It is noted that the half wave plate overlaps outer segments 1203 and 1204.

Figure 13:
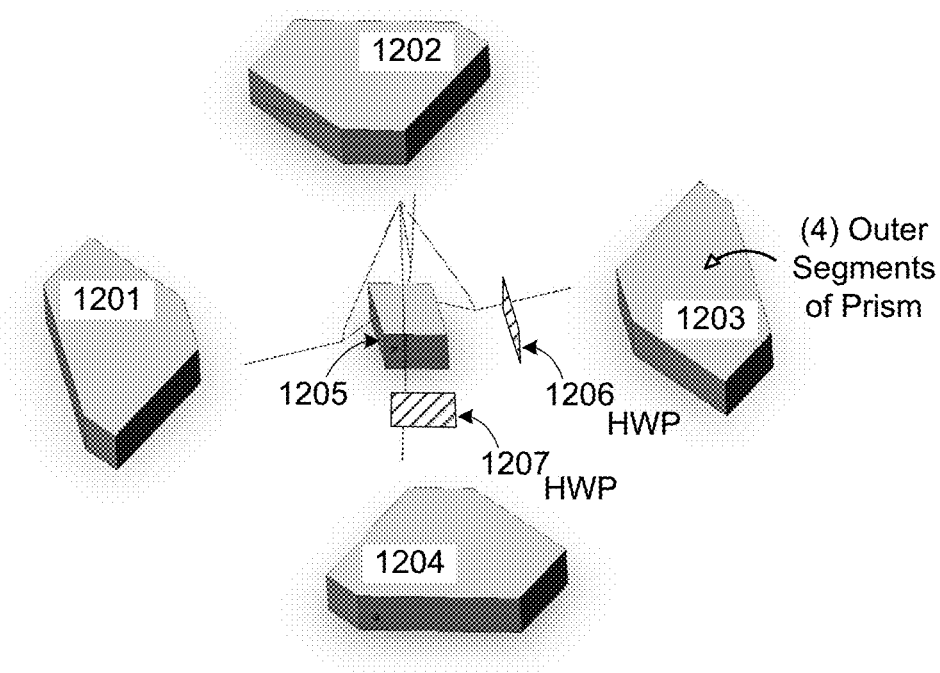
FIG. 13 is an exploded view of the four-input polarization combiner prism of FIG. 11.

FIG. 13 is an exploded view of the four-input polarization combiner prism of FIG. 12. FIG. 13 illustrates the multiple segments of the prism as separate pieces. FIG. 13 shows four outer segments 1201, 1202, 1203, and 1204, as well as a center segment 1205. As explained in connection with FIGS. 7B and 8B, but not shown in FIGS. 13 and 14, a scanning mirror can be disposed above the polarization combiner prism, and an ICG can be disposed below the polarization combiner prism. In some embodiments, as shown in FIG. 13, the polarization combiner prism can also include a first vertical half wave plate (HWP) 1206 between outer segment 1203 and center segment 1205, and a second vertical half wave plate (HWP) 1207 between outer segment 1204 and center segment 1205. Vertical half wave plates 1206 and 1207 serve to reduce unwanted light beams reaching the ICG, as explained below with reference to FIG. 14.

Figure 14:
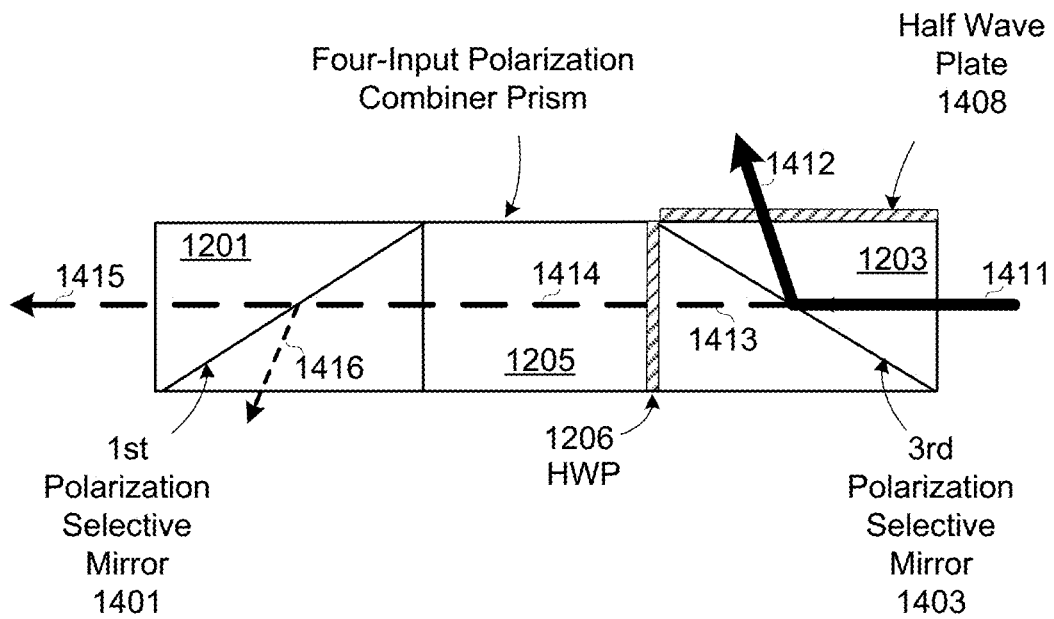
FIG. 14 is a cross-sectional view of the four-input polarization combiner prism along the cut line A-C in FIG. 12.

FIG. 14 is a cross-sectional view of a four-input polarization combiner prism along the cut line A-C in FIG. 12. The four-input polarization combiner prism in FIG. 14 is similar to four-input polarization combiner prism 343 in FIG. 7B or 843 in FIG. 8B. The four-input polarization combiner prism in FIG. 14 can include a first polarization selective mirror 1401, a third polarization selective mirror 1403, and a half wave plate 1408. This example also shows an outer segment 1201, a center segment 1205, and an outer segment 1203. A first vertical half wave plate (HWP) 1206 is disposed between outer segment 1203 and center segment 1205. Incoming light beam 1411 from the right side of the four-input polarization combiner prism is reflected by the third polarization selective mirror 1403 towards the scanning mirror (not shown) through half wave plate 1412. With an ideal polarization selective mirror 1403, 100% of the incoming light beam 1411 would be reflected up towards the scanning mirror. However, with an imperfect polarization selective mirror, a small fraction of incoming light beam 1411 can be transmitted through the mirror, shown as beam 1413. The vertical half wave plate (HWP) 1206 changes the polarization of beam 1414 emerging from half wave plate (HWP) 1206. As beam 1414 reaches the first polarization selective mirror 1401, the converted polarization allows beam 1414 to pass through the first polarization selective mirror 1401 to become beam 1415. The imperfection of first polarization selective mirror 1401 may cause a small fraction of beam 1414 to be reflected as beam 1416 towards the ICG (not shown) below the prism. As an example, assuming the reflectivity of polarization selective mirrors is 99%, then 99% of incoming beam 1411 would be reflected as beam 1412 towards the scanning mirror, and 1% of incoming beam 1411 would be transmitted through the third polarization selective mirror 1403 as beam 1413, which becomes beam 1414 after passing through the HWP 1206. Again, assuming 99% of light beam 1414, now having a non-selected polarization, propagates through the first polarization selective mirror 1401, 1% of beam 1414 would be reflected as beam 1416 towards the ICG. Thus, the vertical half wave plate (HWP) 1206 serves to reduce the unwanted portion of light beam 1413 from reaching the ICG. In this example, the unwanted light beam 1416 would be only about 0.01% of incoming light beam 1411. It is noted that the vertical half wave plate (HWP) 1206 can also serve a similar function to reduce leakage light from an input beam originating from the left side of the four-input polarization combiner prism.

As described above, in some embodiments, augmented reality glasses can include a first laser, a second laser, and a scanning mirror. An example of the augmented reality glasses can be found in FIGS. 1-4. The augmented reality glasses can also include a first polarization selective reflector and a second polarization selective reflector, as described in FIGS. 7A-8B. The first polarization selective reflector is arranged to receive light from the first laser and reflect light received from the first laser at a first angle to the scanning mirror, and the second polarization selective reflector is arranged to receive light from the second laser and reflect light received from the second laser at a second angle to the scanning mirror. The augmented reality glasses can also have an eyepiece having an input coupling port (e.g., an ICG) arranged to receive light reflected by the scanning mirror, as illustrated in FIGS. 4, 7B, and 8B. In some embodiments, the first polarization selective reflector and the second polarization selective reflector are located at least partly overlying the input coupling port.

In some embodiments of the above augmented reality glasses, as shown in FIGS. 7A and 7B, the first set of RGB lasers 341A is configured to emit light having a first polarization state, and the second set of RGB lasers 341C is configured to emit light having the first polarization state. The first set of RGB lasers is arranged to emit light in a first direction and the second set of RGB lasers is arranged to emit light in a second direction. The first polarization state can be either p-polarization or s-polarization. The first polarization selective reflector 346A is configured to reflect light of the first polarization state, and the second polarization selective reflector 346C is configured to reflect light of the second polarization state. For these embodiments, a first wave plate, e.g., half wave plate 353 in FIG. 7B, is positioned along a first optical path between the first polarization selective reflector and the second polarization selective reflector that includes the scanning mirror. The first wave plate can be a half wave plate, configured to change the polarization of light beams, so that the light beams reflected from the scanning mirror can pass through the polarization selective reflectors to reach the input coupling port of the eyepiece waveguide.

In some embodiments of the above augmented reality glasses, as shown in FIG. 8B, the first set of RGB lasers is configured to emit light having a first polarization state, and the second set of RGB lasers is configured to emit light having a second polarization state. The first polarization selective reflector is configured to reflect light of the first polarization state, and the second polarization selective reflector is configured to reflect light of the second polarization state. In these embodiments, no wave plate for polarization conversion is needed. The light beams reflected from the scanning mirror can pass through the polarization selective reflectors having different polarization selectivity to reach the input coupling port of the eyepiece waveguide.

In some embodiments, the augmented reality glasses can have a prism with the first polarization selective reflector, the second polarization selective reflector and the first wave plate are embedded in the prism. An example of four-input polarization combiner prisms 343 and 843 are shown in FIGS. 7A, 7B and 8A, 8B, respectively.

In some embodiments, the augmented reality glasses can have a second wave plate positioned along a second optical path between the first polarization selective reflector and the second polarization selective reflector. In some embodiments, the second optical path includes the scanning mirror.

In some embodiments, the scanning mirror can include a two axis scanning mirror, for example, scanning mirror 351 in FIG. 7B and scanning mirror 851 in FIG. 8B.

In some embodiments, the augmented reality glasses can further have a third set of RGB lasers and a fourth set of RGB lasers. The augmented reality glasses can also have a third polarization selective reflector arranged to receive light from the third set of RGB lasers and reflect light received from the third set of RGB lasers at a third angle to the scanning mirror. The augmented reality glasses can also have a fourth polarization selective reflector arranged to receive light from the fourth set of RGB lasers and reflect light received from the fourth set of RGB lasers at a fourth angle to the scanning mirror. In some embodiments, the set of RBG lasers is replaced with a single, multi-wavelength laser that can emit light at one or more wavelengths, either sequentially or concurrently.

In some embodiments, the third set of RGB lasers is configured to emit light having the first polarization state, and the fourth set of RGB lasers is configured to emit light having the second polarization state. Further, the third polarization selective reflector is configured to reflect light of the first polarization state, and the fourth polarization selective reflector is configured to reflect light of the second polarization state.

In some embodiments, the augmented reality glasses also include a first RGB beam combiner and a second RGB beam combiner. The first set of RGB lasers includes a first red laser, and the augmented reality glasses also include a first blue laser and a first green laser. The first red laser, the first blue laser, and the first green laser are coupled through the first RGB beam combiner to the first polarization selective reflector. The second set of RGB lasers includes a second red laser, and the augmented reality glasses also include a second blue laser and a second green laser. The second red laser, the second blue laser, and second green laser are coupled through the second RGB beam combiner to the first polarization selective reflector.

Figure 15:
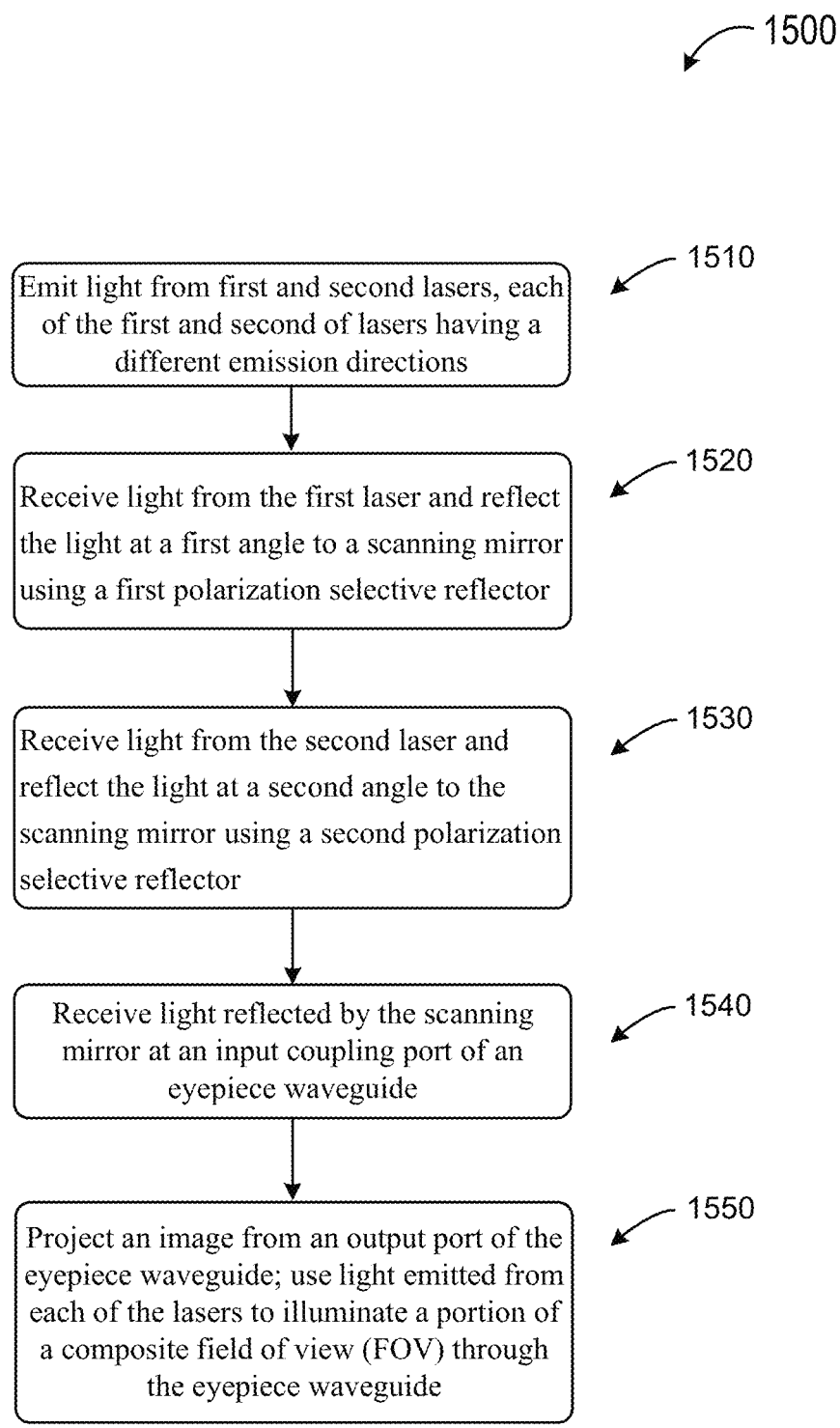
FIG. 15 is a flowchart illustrating a method for displaying an image in a waveguide display according to some embodiments.

FIG. 15 is a flowchart illustrating a method 1500 for displaying an image in a waveguide display according to some embodiments. As shown in FIG. 15, at 1510, the method 1500 for displaying an image in a waveguide display includes emitting light from first and second lasers, each of the first and second of lasers having a different emission direction.

At 1520, the method 1500 includes receiving light beams from the first laser and reflecting light received from the first laser at a first angle to a scanning mirror using a first polarization selective reflector.

At 1530, the method 1500 includes receiving light beams from the second laser and reflecting light received from the second laser at a second angle to a scanning mirror using a second polarization selective reflector.

At 1540, the method 1500 also includes receiving light reflected by the scanning mirror at an input coupling port of an eyepiece waveguide. At 1550, the method includes projecting an image from an output coupling port of the eyepiece waveguide. Here, the image is formed using light emitted from each of the first laser and the second laser to illuminate a portion of a composite field of view (FOV) through the eyepiece waveguide to form a virtual image at some distance (e.g., ranging from infinity to closer distance) from the user.

In some embodiments, four sets of scanning light beams are configured to provide a tiled image with four quadrants to form an enlarged composite field of view. In other embodiments, a different number of scanning light beams can be used to form an enlarged composite field of view of different sizes and shapes.

The image display systems described above may be operatively coupled, such as by a wired lead or wireless connectivity, to a data processing module, which may be mounted in a variety of configurations, such as fixedly attached to the frame, fixedly attached to a helmet or hat worn by the user, embedded in headphones, or otherwise attached to a user. The data processing module may include one or more processors configured to analyze and process data and/or image information. For example, image information for each portion of the composite field of view can be used to operate the light sources and the scanning mirror to control the display of images in the large composite field of view.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. Augmented reality glasses comprising:
a first laser;
a second laser;
a scanning mirror;
a first polarization selective reflector arranged to receive light from the first laser and reflect light received from the first laser at a first angle to the scanning mirror;
a second polarization selective reflector arranged to receive light from the second laser and reflect light received from the second laser at a second angle to the scanning mirror; and
an eyepiece having an input coupling port arranged to receive light reflected by the scanning mirror.

2. The augmented reality glasses of claim 1 wherein:
the first laser is configured to emit light having a first polarization state that is either p-polarization or s-polarization;
the second laser is configured to emit light having the first polarization state;
the first polarization selective reflector is configured to reflect light of the first polarization state; and
the second polarization selective reflector is configured to reflect light of the first polarization state.

3. The augmented reality glasses of claim 1 wherein:
the first laser is configured to emit light having a first polarization state;
the second laser is configured to emit light having a second polarization state;
the first polarization selective reflector is configured to reflect light of the first polarization state; and
the second polarization selective reflector is configured to reflect light of the second polarization state.

4. The augmented reality glasses of claim 3 further comprising:
a third laser; and
a fourth laser.

5. The augmented reality glasses of claim 4 further comprising:
a third polarization selective reflector arranged to receive light from the third laser and reflect light received from the third laser at a third angle to the scanning mirror; and
a fourth polarization selective reflector arranged to receive light from the fourth laser and reflect light received from the fourth laser at a fourth angle to the scanning mirror.

6. The augmented reality glasses of claim 5 wherein:
the third laser is configured to emit light having the first polarization state;
the fourth laser is configured to emit light having the first polarization state;
the third polarization selective reflector is configured to reflect light of the first polarization state; and
the fourth polarization selective reflector is configured to reflect light of the first polarization state.

7. The augmented reality glasses of claim 5 wherein:
the third laser is configured to emit light having the first polarization state;
the fourth laser is configured to emit light having the second polarization state;
the third polarization selective reflector is configured to reflect light of the first polarization state; and
the fourth polarization selective reflector is configured to reflect light of the second polarization state.

8. The augmented reality glasses of claim 1 wherein the scanning mirror comprises a two axis scanning mirror.

9. The augmented reality glasses of claim 1 further comprising a first wave plate positioned along a first optical path between the first polarization selective reflector and the second polarization selective reflector.

10. The augmented reality glasses of claim 9 wherein the first wave plate comprises a half wave plate.

11. The augmented reality glasses of claim 9 wherein the first optical path includes the scanning mirror.

12. The augmented reality glasses of claim 9 wherein the first optical path does not include the scanning mirror.

13. The augmented reality glasses of claim 9 comprising a prism wherein the first polarization selective reflector, the second polarization selective reflector and the first wave plate are embedded in the prism.

14. The augmented reality glasses of claim 9 further comprising a second wave plate positioned along a second optical path between the first polarization selective reflector and the second polarization selective reflector.

15. The augmented reality glasses of claim 14 wherein the second optical path includes the scanning mirror.

16. The augmented reality glasses of claim 1 wherein the first laser is arranged to emit light in a first direction and the second laser is arranged to emit light in a second direction.

17. The augmented reality glasses of claim 1 comprising a prism, wherein the first polarization selective reflector and the second polarization selective reflector are embedded in the prism.

18. The augmented reality glasses of claim 1 wherein:
the eyepiece further comprises an orthogonal pupil expander and an exit pupil expander; and
the input coupling port is configured to direct light to the orthogonal pupil expander and the orthogonal pupil expander is configured to direct light toward the exit pupil expander.

19. The augmented reality glasses of claim 1 wherein the first laser comprises a first red laser, the augmented reality glasses further comprising:
a first RGB beam combiner and a second RGB beam combiner; and
a first blue laser and a first green laser, wherein the first red laser, the first blue laser, and the first green laser are coupled through the first RGB beam combiner to the first polarization selective reflector.

20. The augmented reality glasses of claim 1 wherein the first polarization selective reflector and the second polarization selective reflector are located at least partly overlying the input coupling port.

* * * * *